United States Patent
Kodama et al.

(10) Patent No.: US 10,682,707 B2
(45) Date of Patent: Jun. 16, 2020

(54) CUTTING TOOL

(71) Applicant: Kyocera Corporation, Kyoto-shi, Kyoto (JP)

(72) Inventors: Yoshikazu Kodama, Satsumasendai (JP); Hayato Kubo, Satsumasendai (JP); Tadashi Katsuma, Satsumasendai (JP); Kensaku Watanabe, Satsumasendai (JP); Kenji Kumai, Satsumasendai (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 53 days.

(21) Appl. No.: 15/779,532

(22) PCT Filed: Nov. 28, 2016

(86) PCT No.: PCT/JP2016/085150
§ 371 (c)(1),
(2) Date: May 28, 2018

(87) PCT Pub. No.: WO2017/090765
PCT Pub. Date: Jun. 1, 2017

(65) Prior Publication Data
US 2018/0369926 A1 Dec. 27, 2018

(30) Foreign Application Priority Data
Nov. 28, 2015 (JP) .................. 2015-232501

(51) Int. Cl.
*B23B 27/14* (2006.01)
*C23C 16/36* (2006.01)
(Continued)

(52) U.S. Cl.
CPC ........ *B23B 27/148* (2013.01); *B23B 27/1603* (2013.01); *C23C 16/36* (2013.01);
(Continued)

(58) Field of Classification Search
USPC ........... 51/307, 309; 407/119; 428/216, 336, 428/698, 701, 702
See application file for complete search history.

(56) References Cited

U.S. PATENT DOCUMENTS

2009/0214857 A1* 8/2009 Itoh ...................... C23C 16/403
428/336
2009/0269150 A1* 10/2009 Omori .................. B23B 27/141
407/114

FOREIGN PATENT DOCUMENTS

JP H09174304 A 7/1997
JP 2010172989 A 8/2010

OTHER PUBLICATIONS

S. Ruppi, Deposition, microstructure and properties of texture-controlled CVD α-Al2O3 coatings, International Journal of Refractory Metals and Hard Materials, 2005, pp. 306-316, vol. 23, Elsevier.

* cited by examiner

*Primary Examiner* — Archene A Turner
(74) *Attorney, Agent, or Firm* — Viering, Jentschura & Partner MBB (57) ABSTRACT

In an aspect of the disclosure, a cutting tool includes a base member and a coating layer located on a surface of the base member. The coating layer includes a lower layer, an upper layer, and an intermediate layer located between the lower layer and the upper layer. The intermediate layer includes a first layer, a second layer, and a third layer. The first layer contains $TiC_{x1}N_{y1}O_{z1}$ ($0 \leq x1 < 1$, $0 \leq y1 < 1$, $0 < z1 < 1$, and $x1+y1+z1=1$). The second layer contains $TiC_{x2}N_{y2}O_{z2}$ ($0 \leq x2 < 1$, $0 \leq y2 < 1$, $0 < z2 < 1$, and $x2+y2+z2=1$). The third layer is located between the first layer and the second layer, and contains $TiC_{x3}N_{y3}O_{z3}$ ($0 \leq x3 < 1$, $0 \leq y3 < 1$, $0 \leq z3 < 1$, and $x3+y3+z3=1$). Here, $z1 > z3$ and $z2 > z3$.

10 Claims, 3 Drawing Sheets

(51) Int. Cl.
  *C23C 16/40* (2006.01)
  *B23B 27/16* (2006.01)
  *B22F 1/00* (2006.01)
  *B22F 3/10* (2006.01)
  *C22C 29/06* (2006.01)
  *C22C 29/10* (2006.01)
(52) U.S. Cl.
  CPC ............. *C23C 16/40* (2013.01); *B22F 1/0011* (2013.01); *B22F 3/1021* (2013.01); *B22F 2301/15* (2013.01); *B22F 2302/10* (2013.01); *B23B 2200/0471* (2013.01); *C22C 29/067* (2013.01); *C22C 29/10* (2013.01)

CUTTING TOOL

CROSS-REFERENCE TO RELATED APPLICATIONS

This application is a national stage entry according to 35 U.S.C. 371 of PCT Application No. PCT/JP2016/085150 filed on Nov. 28, 2016, which claims priority to Japanese Application No. 2015-232501 filed on Nov. 28, 2015, which are entirely incorporated herein by reference.

TECHNICAL FIELD

The disclosure relates to a cutting tool including a coating layer on a surface of a base member.

BACKGROUND

A cutting tool is known which includes a base member of cemented carbide, cermet, or ceramics, and a coating layer located on a surface of the base member. This type of cutting tool is generally called coated tool. For example, a titanium carbonitride (TiCN) layer and an aluminum oxide ($Al_2O_3$) layer are known as a coating layer.

The cutting tool has a greater opportunity to be used under severe cutting conditions, such as heavy interrupted cutting, along with the recent higher efficiency in a cutting process. A cutting edge is susceptible to large impact during the heavy interrupted cutting. The coating layer is subjected to large impact, and chipping and peeling of the coating layer are likely to occur under the severe cutting conditions. The coating layer therefore needs improvement in fracture resistance in addition to wear resistance.

In Japanese Unexamined Patent Publication No. 9-174304 (Patent Document 1), an intermediate layer composed of needle-shaped particles when viewed from a cross-section direction exists at an interface between a titanium carbonitride layer and an aluminum oxide layer deposited on a surface of the titanium carbonitride layer. The existence of the intermediate layer contributes to improving fracture resistance of a cutting tool described in Patent Document 1.

However, there is still demand for further improved wear resistance and fracture resistance of the coating layer.

SUMMARY

In an aspect of the present disclosure, a cutting tool includes a base member and a coating layer located on a surface of the base member. The coating layer includes a lower layer, an upper layer, and an intermediate layer. The lower layer contains titanium carbonitride. The upper layer is located above the lower layer and contains aluminum oxide of α-type crystal structure. The intermediate layer is located between the lower layer and the upper layer. The intermediate layer includes a first layer, a second layer, and a third layer. The first layer is adjacent to the lower layer and contains $TiC_{x1}N_{y1}O_{z1}$ ($0 \leq x1 < 1$, $0 \leq y1 < 1$, $0 < z1 < 1$, and $x1+y1+z1=1$). The second layer is adjacent to the upper layer and contains $TiC_{x2}N_{y2}O_{z2}$ ($0 \leq x2 < 1$, $0 \leq y2 < 1$, $0 < z2 < 1$, and $x2+y2+z2=1$). The third layer is located between the first layer and the second layer, and contains $TiC_{x3}N_{y3}O_{z3}$ ($0 \leq x3 < 1$, $0 \leq y3 < 1$, $0 \leq z3 < 1$, and $x3+y3+z3=1$). Here, $z1 > z3$ and $z2 > z3$.

DETAILED DESCRIPTION

Figure 1:
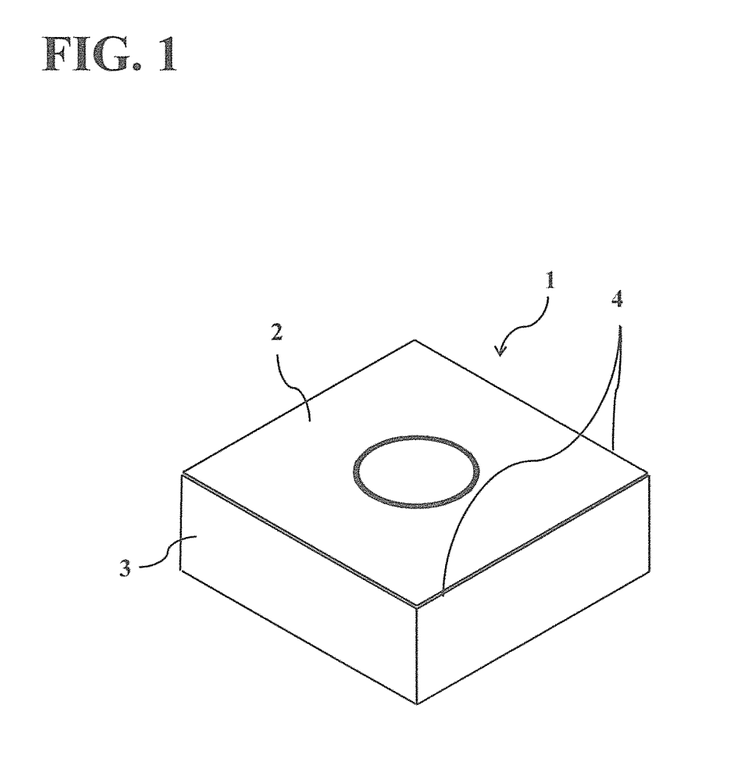
FIG. 1 is a schematic perspective view of a cutting tool in an aspect of the disclosure.

As illustrated in FIG. 1, a cutting tool (hereinafter referred to simply as "a tool") 1 in an aspect of the disclosure has a columnar shape whose major surface has an approximately quadrangular shape. In an aspect of the disclosure, an upper surface in FIG. 1 is the major surface, a part of the major surface constitutes a rake surface 2, and a part of a side surface constitutes a flank surface 3. At least a part of a region where the rake surface 2 intersects with the flank surface 3 constitutes a cutting edge 4.

Figure 2:
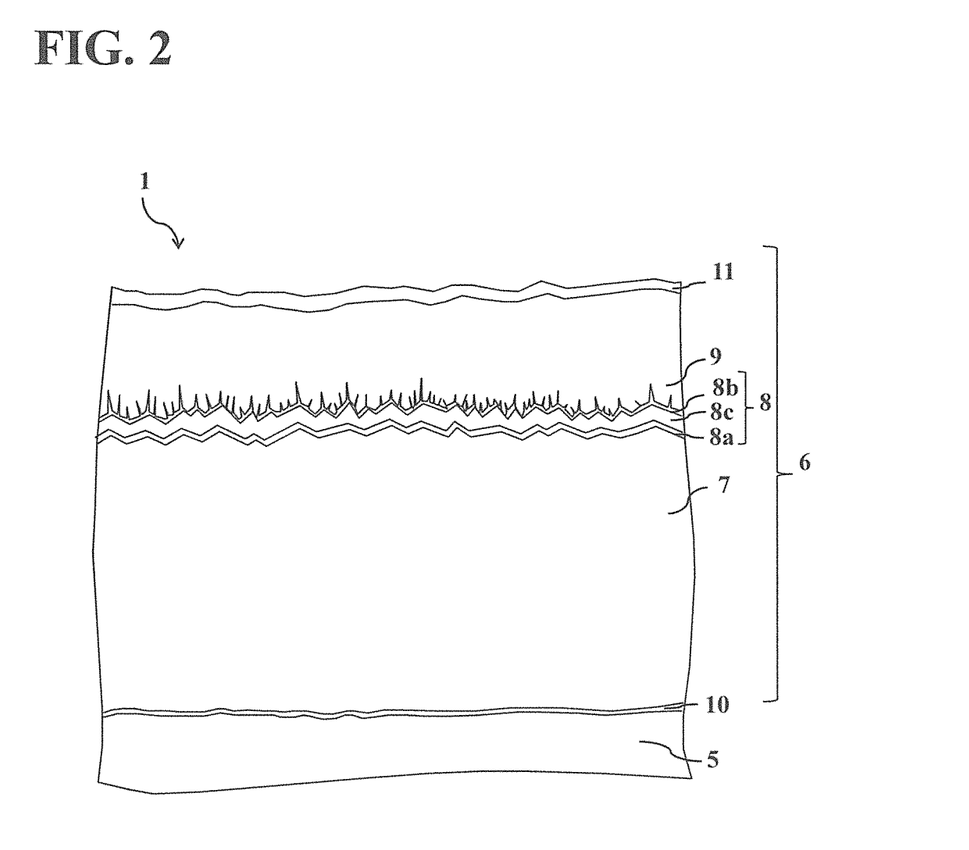
FIG. 2 is a schematic diagram for describing a configuration of a cross section of a coating layer in the cutting tool in FIG. 1.

As in a schematic diagram of a cross section illustrated in FIG. 2, the tool 1 includes a base member 5 and a coating layer 6 located on a surface of the base member 5. The coating layer 6 includes a lower layer 7, an intermediate layer 8, and an upper layer 9. The lower layer 7 is located on the surface of the base member 5. The upper layer 9 is located above the lower layer 7. The intermediate layer 8 is located between the lower layer 7 and the upper layer 9. The lower layer 7 contains titanium carbonitride. The upper layer 9 contains aluminum oxide of α-type crystal structure (α-$Al_2O_3$).

The lower layer 7 may be in contact with the surface of the base member 5. The coating layer 6 may further include a ground layer 10 located between the lower layer 7 and the base member 5. Examples of the ground layer 10 include a layer containing titanium nitride (TiN).

The upper layer 9 may be an outermost layer of the coating layer 6. The coating layer 6 may further include a surface layer 11 located above the upper layer 9. Examples of the surface layer 11 include a layer containing titanium nitride.

As titanium carbonitride contained in the lower layer 7, there is, for example, so-called MT (moderate temperature)-titanium carbonitride, which can be formed by deposition using a raw material containing acetonitrile ($CH_3CN$) gas at a relatively low temperature of 780-900° C. Crystals 12 of the titanium carbonitride in the lower layer 7 may be composed of columnar crystals that are narrow and long in a thickness direction of the coating layer 6.

When a mean crystal width w of the crystals 12 of the titanium carbonitride in a direction parallel to the surface of the base member 5 (a crosswise direction in FIG. 2) is 100-800 nm, the lower layer 7 has high toughness and has effects of absorbing impact exerted on the coating layer 6, thus improving fracture resistance of the coating layer 6. In a non-limiting embodiment, a range of the mean crystal width w may be 400-600 nm.

Here, the titanium carbonitride contained in the lower layer 7 is represented by $TiC_xN_y$. When $0.4 \leq x \leq 0.8$, $0.2 \leq y \leq 0.6$, and $x+y=1$, the coating layer 6 has high wear resistance and fracture resistance. When $0.6 \leq x \leq 0.8$ and $0.2 \leq y \leq 0.4$, the coating layer 6 has higher wear resistance and fracture resistance.

In an aspect of the disclosure, the intermediate layer 8 includes a first layer 8a adjacent to the lower layer 7, a second layer 8b adjacent to the upper layer 9, and a third layer 8c located between the first layer 8a and the second layer 8b. Each of the first layer 8a, the second layer 8b, and third layer 8c contains a titanium compound.

When the titanium compound contained in the first layer $8a$ is represented by $TiC_{x1}N_{y1}O_{z1}$, $0 \leq x1 < 1$, $0 \leq y1 < 1$, $0 < z1 < 1$, and $x1+y1+z1=1$. When the titanium compound contained in the second layer $8b$ is represented by $TiC_{x2}N_{y2}O_{z2}$, $0 \leq x2 < 1$, $0 \leq y2 < 1$, $0 < z2 < 1$, and $x2+y2+z2=1$. When the titanium compound contained in the third layer $8c$ is represented by $TiC_3N_{y3}O_{z3}$, $0 \leq x3 < 1$, $0 \leq y3 < 1$, $0 \leq z3 < 1$, and $x3+y3+z3=1$.

Here, $z1 > z3$ and $z2 > z3$. That is, in the intermediate layer 8 in an aspect of the disclosure, an oxygen content ratio in each of the first layer $8a$ and the second layer $8b$ is relatively greater than that in the third layer $8c$ as described above. Because the intermediate layer 8 is so configured, it is possible to enhance adhesion between the intermediate layer 8 and each of the lower layer 7 and the upper layer 9.

Specifically, the existence of the first layer $8a$ whose oxygen content ratio is relatively greater contributes to enhancing the adhesion of the intermediate layer 8 to the lower layer 7. The existence of the second layer $8b$ whose oxygen content ratio is relatively greater contributes to enhancing the adhesion of the intermediate layer 8 to the upper layer 9. Additionally, because the oxygen content ratio in the second layer $8b$ is relatively greater, the aluminum oxide in the upper layer 9 tends to become the α-type crystal structure.

The oxygen content ratio in the entirety of the intermediate layer 8 is not uniformly high, but the third layer $8c$ whose oxygen content ratio is relatively smaller exists between the first layer $8a$ and the second layer $8b$. Because the oxygen content ratio in the third layer $8c$ is relatively smaller, the third layer $8c$ has higher hardness than the first layer $8a$ and the second layer $8b$. This leads to higher hardness of the intermediate layer 8 as a whole, thereby preventing deterioration in durability of the intermediate layer 8. Thus, the enhanced adhesion and durability of the intermediate layer 8 leads to improved wear resistance and fracture resistance of the coating layer 6.

In particular, the adhesion between the lower layer 7 and the upper layer 9 is high when $0.1 \leq x1 \leq 0.5$, $0.2 \leq y1 \leq 0.5$, and $0.1 \leq z1 \leq 0.4$ in the first layer $8a$, $0.3 \leq x2 \leq 0.8$, $0 \leq y2 \leq 0.3$, and $0.1 \leq z2 \leq 0.5$ in the second layer $8b$, and $0.2 \leq x3 \leq 0.7$, $0.3 \leq y3 \leq 0.8$, and $0 \leq z3 \leq 0.1$ in the third layer $8c$.

In the first layer $8a$ and the second layer $8b$, $z1 \geq z2$ may be established, however, when $z1 < z2$ is established, it is possible to enhance joining properties between the intermediate layer 8 and the lower layer 7 to which the intermediate layer 8 is designed to be joined. This leads to further enhanced durability of the coating layer 6 as a whole.

Figure 3:
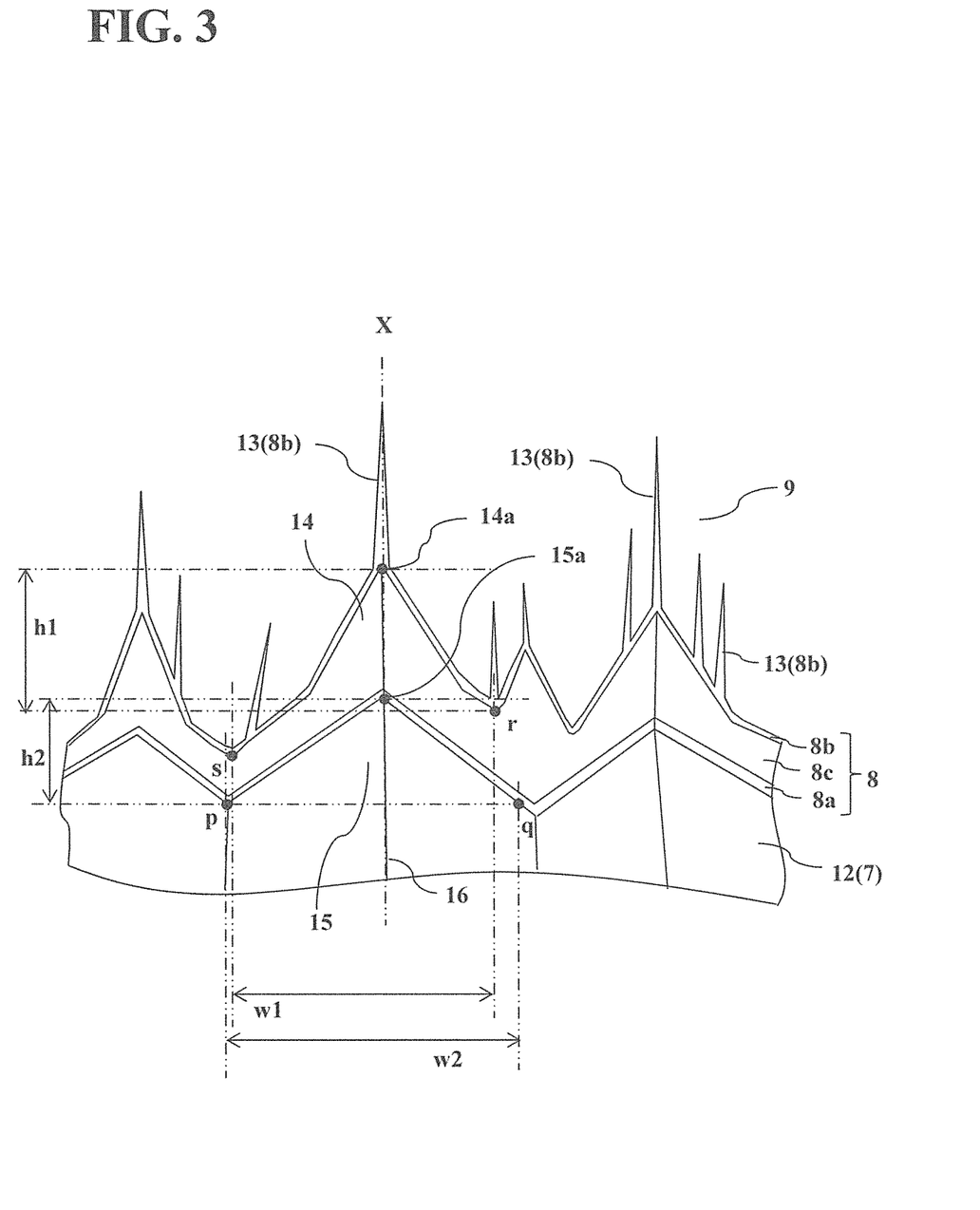
FIG. 3 is an enlarged view of a main part for the purpose of describing a configuration near an intermediate layer of the cutting tool in FIG. 2.

The second layer $8b$ may have a plurality of needle-shaped projections 13 being projected upward in a cross section orthogonal to the surface of the base member 5. As illustrated in FIG. 3, when provided with the plurality of projections 12, the adhesion between the intermediate layer 8 and the upper layer 9 can be further enhanced, consequently improving the fracture resistance of the tool 1. One possible reason for further enhancement of the adhesion between the intermediate layer 8 and the upper layer 9 is that the projections 13 serve as a wedge.

As used herein, the needle-shaped projection 13 denotes such a shape that is 3 or more in terms of ratio obtained by dividing a length of the projection 13 in a direction orthogonal to the surface of the base member 5 by a width in a direction parallel to the surface of the base member 5 at a midpoint of the length of the projection 13 in the above-mentioned cross section.

Each of the projections 13 may have a length of 20-300 nm in a non-limiting embodiment of the disclosure. High adhesion between the intermediate layer 8 and the upper surface 9 is ensured when a mean length of the projections 13 is 40-100 nm. High adhesion between the intermediate layer 8 and the upper surface 9 is also ensured when the number of the projections 13, which extend at an inclination angle of not more than 10° with respect to the direction orthogonal to the surface of the base member 5, accounts for 80% or more of a total number of the projections 13.

Although the number of the needle-shaped projections 13 is not particularly limited, the high adhesion between the intermediate layer 8 and the upper surface 9 is ensured when three or more of the projections 13 exist on average in a range of 0.5 μm in a direction parallel to the surface in the above-mentioned cross section.

A surface of the third layer $8c$ located below the second layer $8b$ may be flat, or alternatively, include one or a plurality of first protrusions 14 being protruded upward. When the third layer $8c$ includes the first protrusion 14, a joining area between the second layer $8b$ and the third layer $8c$ is increased to enhance the adhesion between these two layers. The first protrusion 14 does not necessarily have especially a needle shape.

When at least one of the projections 13 is protruded upward from a top portion $14a$ of the first protrusion 14, it becomes easy for a front end of the projection 13 to be located deeper in a thickness direction in the upper layer 9. This makes it possible to enhance the role of the wedge, thereby further improving the adhesion between the intermediate layer 8 and the upper layer 9.

A surface of the lower layer 7 located below the intermediate layer 8 may be flat, or alternatively, include one or a plurality of second protrusions 15 being protruded upward. When the lower layer 7 includes the second protrusion 15, a joining area between the intermediate layer 8 and the lower layer 7 is increased to enhance the adhesion between these two layers. The second protrusion 15 does not necessarily have especially a needle shape.

The titanium carbonitride contained in the lower layer 7 has a crystal structure extending in the direction orthogonal to the surface of the base member 5. The crystals 12 of the titanium carbonitride may include a twin boundary 16 extending in the direction orthogonal to the surface of the base member 5. In this case, the second protrusion 15 is a part of the lower layer 7 which is in contact with the intermediate layer 8, and which corresponds to a front end portion of the crystal 12 whose top portion is the twin boundary 16.

The first protrusions 14 can be classified into one which is located above the second protrusion 15 in the lower layer 7, and one which is not located above the second protrusion 15. As used herein, the phrase that the first projection 14 is located above the second protrusion 15 in the lower layer 7 denotes a state in which a top portion of the second protrusion 15 is connectable to a top portion of the first protrusion 14 by an imaginary straight line X as illustrated in FIG. 3. When at least one of the projections 13 is located on the imaginary straight line X passing through the top portion $14a$ of the first protrusion 14 and the top portion $15a$ of the second protrusion 15, it is easy for the front end of the projection 13 to be located more deeper in the thickness direction in the upper layer 9. Therefore, the adhesion between the intermediate layer 8 and the upper layer 9 in a region where the coating layer 6 is susceptible to peeling, specifically, in the top portion $14a$ of the first protrusion 14 and the top portion $15a$ of the second protrusion 15, thereby further improving the wear resistance and fracture resistance of the coating layer 6.

Here, when the length of the projection 13 on the imaginary straight line X is greater than a length of the third layer 8c on the imaginary straight line X, it is possible to further improve the adhesion between the intermediate layer 8 and the upper layer 9.

When the first protrusions 14 have a mean width of 80-300 nm and a mean height of 50-200 nm, it is possible to enhance the adhesion between the lower layer 7, the intermediate layer 8, and the upper layer 9. A range of the mean width of the first protrusions 14 may be 100-200 nm in a non-limiting embodiment of the disclosure, or a range of the mean height may be 100-150 nm.

As illustrated in FIG. 3, a width w1 of the first protrusion 14 denotes a distance between bottoms r and s of skirts on opposite sides extending from the top portion 14a of the first protrusion 14 toward the base member 5 when a parallel line parallel to the surface of the base member 5 intersects with the skirt at a side of the bottom s after passing through the bottom r of the skirt away from the base member 5 (a side having a greater height from the base member 5). As illustrated in FIG. 3, a height h1 of the first protrusion 14 denotes a distance h1 of a vertical line from a parallel line serving as a reference of the width w1 of the first protrusion 14 to the top portion 14a of the first protrusion 14. A mean height of the first protrusions 14 is determined by a mean value of the heights h1 of not less than three first protrusions 14 adjacent to each other. A length of the projection 13 that exists at the top portion 14a of the first protrusion 14 is measured using, as a starting point, an intersection point of extended two ridge lines being continuous with the top portion 14a of the first protrusion 14.

When the crystal 12 of the titanium carbonitride in the lower layer 7 has the twin boundary 16, the twin boundary 16 may be continued because crystals of the first layer 8a and the third layer 8c may grow by succeeding the same crystal structure as the crystal 12 of the titanium carbonitride even when the first layer 8a and the third layer 8c are deposited. In this case, the adhesion between the lower layer 7 and the intermediate layer 8 is further improved.

The adhesion between the lower layer 7, the intermediate layer 8, and the upper layer 9 can be enhanced when the second protrusions 15 have a mean width of 80-600 nm and a mean height of 30-200 nm in an aspect of the disclosure. The second protrusions 15 may have a mean width in a range of 200-400 nm and a mean height in a range of 60-150 nm in a non-limiting embodiment of the disclosure.

As illustrated in FIG. 3, a width w2 of the second protrusion 15 denotes a distance between bottoms p and q of skirts on opposite sides extending from the top portion 15a of the second protrusion 15 toward the base member 5 when a parallel line parallel to the surface of the base member 5 intersects with the skirt at a side of the bottom q after passing through the bottom p of the skirt away from the base member 5 (a side having a greater height from the base member 5). A mean width of the second protrusions 15 is determined by a mean value of the widths w2 of not less than three second protrusions 15 adjacent to each other. As illustrated in FIG. 3, a height h2 of the second protrusion 15 denotes a distance h2 of a vertical line from a parallel line as a reference of the width w2 of the second protrusion 15 to the top portion 15a of the second protrusion 15. A mean height of the second protrusions 15 is determined by a mean value of the heights h2 of not less than three second protrusions 15 adjacent to each other.

A thickness of the second layer 8b is not particularly limited to a specific value. However, when being 10-35 nm, the aluminum oxide in the upper layer 9 tends to become the α-type crystal structure without deterioration in hardness of the intermediate layer 8. When the second layer 8b includes the projections 13, the thickness of the second layer 8b denotes a thickness excluding the projections 13. Bending points exist in a region where the projections 13 exist and a region where no projection 13 exists. It is therefore easy to determine a boundary therebetween, making it possible to measure the thickness of the second layer 8b excluding the projections 13.

Adhesion between the second layer 8b and the upper layer 9 is improved when the first layer 8a has a thickness of 5-50 nm and the third layer 8c has a thickness of 50-300 nm. The first layer 8a may have a thickness range of 10-35 nm in a non-limiting embodiment of the disclosure. The third layer 8c may have a thickness range of 70-100 nm in a non-limiting embodiment of the disclosure.

As illustrated above, when the thickness of the third layer 8c is greater than the thickness of each of the first layer 8a and the second layer 8b, the hardness of the intermediate layer 8 is further enhanced as a whole. This further ensures to prevent deterioration in durability of the intermediate layer 8.

The thickness of each of the first layer 8a, the second layer 8b, and the third layer 8c is a mean value of values obtained by carrying out thickness measurement at ten or more portions located at equal intervals on the basis of a boundary line of the crystals 12 of titanium carbonitride, the first layer 8a, and the third layer 8c in a field of vision in which three or more crystals 12 of titanium carbonitride exist.

Structure and thickness of each of the layers, and shape of crystals constituting each of the layers are measurable by observing an electron micrography (a scanning electron microscope (SEM) photograph or a transmission electron microscopy (TEM) photograph) in a cross section of the tool 1. A mean crystal width of individual crystals is a value obtainable by finding individual widths in a direction parallel to the surface of the base member 5 in an intermediate length of a length in a thickness direction of individual crystals, and by averaging the widths. In an aspect of the disclosure, the phrase that the crystal form of the crystals constituting each layer of the coating layer 6 is a columnar shape denotes a state in which a ratio of a mean crystal width of the individual crystals to a length in the thickness direction of the coating layer 6 is 0.3 or less on average. One in which the ratio of the mean crystal width of the individual crystals to the length in the thickness direction of the coating layer 6 exceeds 0.3 on average is defined that a crystal form thereof is a granular shape.

In an aspect of the disclosure, the upper layer 9 contains crystals of aluminum oxide of α-type crystal structure, and has high hardness and wear resistance. When an orientation coefficient Tc(104) of the upper layer 9 on a surface side is 2 or more, which is expressed in the following general formula Tc (hkl), and is obtainable by an X-ray diffraction analysis measured from the surface of the coating layer 6, the wear resistance of the upper layer 9 is improved. Consequently, the tool 1 becomes the tool 1 usable over a long term. The Tc(104) on the surface side may be in a range of 2-3.5 in a non-limiting embodiment of the disclosure.

Here, (hkl) is a crystal plane of any one of (012), (104), (110), (113), (006), (024), (116), and (214), and an orientation coefficient Tc(hkl) is expressed by Tc(hkl)={I(hkl)/$I_0$(hkl)}/[(⅛)×Σ {I(HKL)/$I_0$(hkl)}]. Here, (HKL) is a crystal plane of (012), (104), (110), (113), (006), (024), (116), and (214); I is peak strength ascribed to each of the crystal planes; and $I_0$ is a standard diffraction intensity of each of the crystal planes described on JCPDS (Joint Committee on Powder Diffraction Standards) card No. 00-010-0173.

Although a reason why the Tc(104) has a value as high as 2 or more is not clear, an orientation direction of crystals of aluminum oxide seems to change depending on the composition and shape of the intermediate layer 8.

In an aspect of the disclosure, an orientation coefficient Tc(104) on a side of the base member 5 in a portion having a thickness of 10-40% from the side of the base member 5 is smaller than an orientation coefficient Tc(104) on a surface side in the upper layer 9. In other words, when a peak on the side of the base member 5 detectable by measurement in a state in which only a portion of the upper layer 9 which is located on the side of the base member 5 is left by polishing a part of the upper layer 9 is compared with a surface side peak detectable by measurement from the surface side of the upper layer 9, the Tc(104) on the surface side in the surface side peak is greater than the Tc(104) on the side of the base member 5 in the peak on the side of the base member 5.

More specifically, the Tc(104) on the side of the base member 5 is smaller than the Tc(104) on the surface side. When the orientation coefficient Tc(104) on the side of the base member 5 in the upper layer 9 is smaller, a difference between a thermal expansion rate of the upper layer 9 and a thermal expansion rate of each of the intermediate layer 8 and the lower layer 7 becomes smaller, and the upper layer 9 is therefore less likely to peel off. A range of the Tc(104) on the side of the base member 5 may be 0.1-1.1 in a non-limiting embodiment of the disclosure, or 0.5-1.1 in another non-limiting embodiment of the disclosure.

A method of measuring the Tc(104) on the side of the base member 5 and the Tc(104) on the surface side in the upper layer 9 is described below. An X-ray diffraction analysis of the upper layer 9 is measured using an X-ray diffraction analysis apparatus using a general CuKα ray. Because the measurement is made on a flat surface having a large area, the measurement is made on the flank surface 3 when the rake surface 2 is provided with irregularities, such as a breaker. When finding peak strength of each of the crystal planes of the upper layer 9 from an X-ray diffraction chart, a crystal plane of a detected peak is identified and peak strength thereof is measured by checking a diffraction angle of each of the crystal planes described at No. 00-101-0173 of the JCPDS card.

For measuring the Tc(104) on the surface side, measurement is made from the surface side of the upper layer 9. Specifically, the X-ray diffraction analysis is carried out on the coating layer 6 in a state in which the surface layer 11 is removed by polishing, or in a state in which the surface layer 11 is not polished. An orientation coefficient Tc(hkl) is calculated by measuring peak strength of each of obtained peaks. When removing the surface layer 11 by polishing, 20% or less of the thickness of the upper layer 9 may be removed. Even when the X-ray diffraction analysis is carried out in the state in which the surface layer 11 is not subjected to polishing, nine peaks of the aluminum oxide need to be measured. A surface side peak is detected while also including an orientation state on the side of the base member 5 of the upper layer 9. However, because a structure state of the upper layer 9 which is located at a position near a measured surface in the X-ray diffraction analysis has a great influence on the peak, the orientation state on the side of the base member 5 has less influence on the surface side peak.

In order to measure the Tc(104) on the side of the base member 5, peak strength is measured in a state in which only a part of the upper layer 9 which is close to the base member 5 is left by polishing a part of the upper layer 9. Specifically, the upper layer 9 of the coating layer 6 is firstly polished until reaching a thickness of 10-40% of the thickness of the upper layer 9 before polishing. The polishing is carried out by a brushing process using diamond abrasive grains, a process using elastic grinding wheels, or a blast process. Thereafter, the polished part of the upper layer 9 is subjected to an X-ray diffraction analysis under the same conditions as the measurement on the part on the surface side of the upper layer 9, and peaks of the upper layer 9 are measured to calculate an orientation coefficient Tc(hkl).

The Tc(104) on the surface side in surface side peaks of the upper layer 9 measured by the above method is comparable with the Tc(104) on the side of the base member 5. The orientation coefficient Tc is obtainable by a ratio to standard data of non-orientation prescribed by JCPDS cards, and is therefore an index indicating a degree of orientation of each of the crystal planes.

When top two peak strengths on the surface in the upper layer 9 are I(116) and I(104), specifically, when one of I(116) and I(104) is the strongest and the other of I(116) and I(104) is the second strongest in terms of surface side peak of the upper layer 9, crater wear is less likely to occur in the rake surface 2, and flank wear due to micro-chipping is less likely to occur in the flank surface 3. Here, I(104) may be the strongest and I(116) may be the second strongest, or alternatively, I(116) may be the strongest and I(104) may be the second strongest.

In an aspect of the disclosure, when the Tc(104) on the surface side in the surface side peaks is greater than the Tc(104) on the side of the base member 5 in the peaks on the side of the base member 5, the flank wear is much less likely to occur in the flank surface 3, and the fracture resistance in the rake surface 2 can be enhanced to produce effects of enhancing the fracture resistance of the cutting tool 1.

When the Tc(006) on the surface side is 1 or more in addition to that Tc(104) on the surface side is greater than Tc(104) on the side of the base member 5, crater wear resistance of the upper layer 9 is significantly improved.

The ground layer 10 in an aspect of the disclosure contains titanium nitride. The ground layer 10 prevents ingredients in the base member 5, such as cobalt (Co), carbon (C), and tungsten (W), from diffusing into the lower layer 7. Consequently, hardness of the surface part of the base member 5 and hardness of the lower layer 7 are less likely to deteriorate. The ground layer 10 may contain only titanium nitride, or alternatively, may contain, besides titanium nitride, titanium carbonitride, titanium oxycarbonitride (TiCNO), and chrome nitride (CrN). A thickness of the ground layer 10 is settable to, for example, 0.1-1 μm.

The surface layer 11 in an aspect of the disclosure contains titanium nitride. The surface layer 11 may contain only titanium nitride, or alternatively, may contain, besides titanium nitride, titanium carbonitride, titanium oxycarbonitride, and chrome nitride. The surface layer 11 is composed of a colored material and disposed in order to easily determine whether the cutting edge 4 is already used. A thickness of the surface layer 11 is settable to, for example, 0.1-3 μm.

Although a material of the base member 5 is not particularly limited, there are, for example, cemented carbide, Ti-based cermet, and ceramics. Examples of the cemented carbide include one in which a hard phase containing tungsten carbide (WC) and at least one kind selected from the group consisting of carbides, nitrides, carbonitrides of metals of the periodic table groups 4, 5, and 6 if desired is bound by a binder phase containing an iron group metal, such as cobalt and nickel (Ni). Examples of the ceramics include silicon nitride ($Si_3N_4$), aluminum oxide, diamond, and cubic boron nitride (cBN). The base member 5 may be one which is composed of metal, such as carbon steel, high-speed steel, and alloy steel, depending on the intended use.

The tool 1 is designed to carry out a cutting process by bringing the cutting edge 4, which is formed at an intersecting part of the rake surface 2 and the flank surface 3, into contact with a workpiece. The tool 1 is capable of producing the excellent effects described above. The tool 1 of an aspect of the disclosure is applicable to, besides cutting tools, various kinds of uses, for example, wear resistant parts such as sliding parts and metal molds, excavating tools, tools such as edged tools, and impact-resistant components. The tool 1 also has excellent mechanical reliability in these applications.

A method of manufacturing the cutting tool in an aspect of the disclosure is described below by referring to an aspect of a method of manufacturing the tool 1.

Firstly, for example, metal powder and carbon powder are properly added to inorganic powder selected from among metal carbides, nitrides, carbon nitrides, and oxides. These are then mixed together. A molded body is prepared by molding the powders thus mixed into a predetermined shape with the use of a known molding method. Examples of the molding method include press molding, casting molding, extrusion molding, and cold isostatic press molding. The base member 5 is prepared by sintering the molded body in vacuum or non-oxidization atmosphere. A polising process or honing process may applied to the surface of the base member 5 as necessary.

Subsequently, the coating layer 6 is deposited on the surface of the base member 5 by chemical vapor deposition (CVD) method.

Firstly, a first mixed gas, which is used as a reaction gas, is prepared by mixing 0.5-10% by volume of titanium tetrachloride ($TiCl_4$) gas and 10-60% by volume of nitrogen ($N_2$) gas into hydrogen ($H_2$) gas. The ground layer 10 containing titanium nitride is deposited by introducing the first mixed gas into a chamber while controlling a deposition temperature at 800-940° C. and a pressure in the chamber at 8-50 kPa.

Subsequently, a second mixed gas is prepared by mixing 0.5-10% by volume of titanium tetrachloride ($TiCl_4$) gas, 5-60% by volume of nitrogen ($N_2$) gas, and 0.1-3% by volume of acetonitrile gas into hydrogen ($H_2$) gas. The lower layer 7 is deposited by introducing the second mixed gas into the chamber while controlling a deposition temperature at 780-880° C. and a pressure in the chamber at 5-25 kPa.

Here, a mean crystal width of titanium carbonitride columnar crystals constituting the lower layer 7 can be made greater on a side away from the base member 5 than that at a side close to the base member 5 by increasing a content ratio of acetonitrile gas at a later stage of deposition than that at an initial stage of deposition.

Then, the intermediate layer 8 is prepared. A third mixed gas is prepared by mixing 3-30% by volume of titanium tetrachloride gas, 3-15% by volume of methane ($CH_4$) gas, 5-10% by volume of nitrogen ($N_2$) gas, 0.5-1% by volume of carbon oxide (CO) gas, and 0.5-10% by volume of aluminum trichloride ($AlCl_3$) gas into hydrogen ($H_2$) gas. The first layer 8a is deposited by introducing the third mixed gas into the chamber while controlling a deposition temperature at 900-1050° C. and a pressure in the chamber at 5-40 kPa.

Subsequently, a fourth mixed gas is prepared by mixing 1-4% by volume of titanium tetrachloride ($TiCl_4$) gas, 0.1-10% by volume of methane gas, and 5-20% by volume of nitrogen gas into hydrogen gas. The third layer 8c is deposited by introducing the fourth mixed gas into the chamber while controlling a deposition temperature at 900-1050° C. and a pressure in the chamber at 5-40 kPa. Although no oxygen source is contained in the fourth mixed gas, part of oxygen diffuses from the first layer 8a.

Subsequently, a fifth mixed gas is prepared by mixing 3-15% by volume of titanium tetrachloride gas, 3-10% by volume of methane gas, 3-25% by volume of nitrogen gas, and 0.5-2% by volume of carbon oxide gas into hydrogen gas. The second layer 8b is deposited by introducing the fifth mixed gas into the chamber while controlling a deposition temperature at 900-1050° C. and a pressure in the chamber at 5-40 kPa.

Then, the upper layer 9 is prepared. A sixth mixed gas is prepared by mixing 5-15% by volume of aluminum trichloride ($AlCl_3$) gas, 0.5-2.5% by volume of hydrogen chloride (HCl) gas, 0.5-5% by volume of carbon dioxide gas, and 0-1% by volume of hydrogen sulfide ($H_2S$) gas into hydrogen gas. The upper layer 9 is deposited by introducing the sixth mixed gas into the chamber while controlling a deposition temperature at 950-1100° C. and a pressure in the chamber at 5-20 kPa.

Then, the surface layer 11 is deposited if desired. A seventh mixed gas is prepared by mixing 0.1-10% by volume of titanium tetrachloride gas and 10-60% by volume of nitrogen gas into hydrogen gas. The surface layer 11 is deposited by introducing the seventh mixed gas into the chamber while controlling a deposition temperature at 960-1100° C. and a pressure in the chamber at 10-85 kPa.

Thereafter, if necessary, a polishing process is carried out on a region of the surface of the deposited coating layer 6 in which the cutting edge 4 is located. After completion of the polishing process, it is easy to prevent a workpiece from being welded to the cutting edge 4, thus leading to the tool 1 with more excellent fracture resistance.

EXAMPLES

A mixed powder was prepared which contained 6% by mass of metal cobalt powder having a mean particle diameter of 1.2 μm, 0.5% by mass of titanium carbide (TiC) powder having a mean particle diameter of 2 μm, 5% by mass of niobium carbide (NbC) having a mean particle diameter of 2 μm, and the rest being tungsten carbide powder having a mean particle diameter of 1.5 μm. A molded body was prepared by molding the mixed powder into a tool shape (CNMG120408) with the use of press molding. A base member was prepared by applying a debinder process to the molded body, followed by sintering in vacuum at 1500° C. and 0.01 Pa for one hour. Thereafter, the prepared base member was subjected to a brushing process, and a part serving as a cutting edge in a tool was subjected to round honing.

A cutting tool was manufactured by depositing a coating layer on the base member by a chemical vapor deposition method under deposition conditions in Table 1. Individual compounds were respectively expressed by chemical symbols in Tables 1 to 3. The results were presented in Tables 2 to 3.

A thicknesses and a mean crystal particle diameter of each of the layers were measured by observing a cross section which includes the coating layer and is orthogonal to the surface of the base member in the above samples with the use of an SEM. A thickness of each of the layers, a mean width, and a mean height of each of the first protrusions and the second protrusions, and the number and a mean length of needle-shaped projections in the second layer were measured by observing the vicinity of the intermediate layer with the use of a TEM.

A flat surface of a flank surface of the cutting tool was subjected to an X-ray diffraction analysis using a CuKα ray without polishing the coating layer, and identifications of surface side peaks measured from the surface side of the upper layer (indicated as a surface side or surface side peak in Tables) and peak strength of each of the peaks were carried out at three arbitrary portions.

Of the surface side peaks, a peak having the highest strength and a peak having the second highest strength were determined, and an orientation coefficient Tc of a (104) plane of JCPDS card was calculated. Then, polishing was carried out until reaching a thickness of 10-40% of a thickness of the upper layer, and a base member side peak (indicated as a base member side in Tables) measured in a state in which only a part close to the base member was left by polishing a part of the upper layer was identified, and peak strength of each of the peaks was measured by a similar X-ray diffraction analysis. An orientation coefficient Tc of the (104) plane was calculated using the peak strength of each of the obtained peaks. A thickness of each of the layers was measured by observing a fracture surface of the tool with an SEM. The results were presented in Table 3.

Wear resistance and fracture resistance were evaluated by conducting a continuous cutting test and an interrupted cutting test using the obtained cutting tool under the following conditions. The results were presented in Table 3.

(Continuous Cutting Conditions)
Workpiece: chromium molybdenum steel material (SCM435)
Tool shape: CNMG120408
Cutting speed: 300 m/min
Feed rate: 0.3 mm/rev
Depth of cut: 1.5 mm
Cutting time: 25 min
Other: Using water-soluble cutting fluid
Evaluation item: Measuring a flank wear width on the flank surface in an actually worn portion by observing a cutting edge honed part with a scanning electron microscope (Interrupted Cutting Conditions)
Workpiece: chromium molybdenum steel, steel material with
four grooves (SCM440)
Tool shape: CNMG120408
Cutting speed: 300 m/min
Feed rate: 0.3 mm/rev
Depth of cut: 1.5 mm
Other: Using water-soluble cutting fluid
Evaluation item: Measuring the number of impacts until reaching a fracture

TABLE 1

| Coating layer | Mixed gas composition (% by volume) | Chamber Temperature (° C.) | Pressure (kPa) |
|---|---|---|---|
| TiN-1 | $TiCl_4$: 2.5, $N_2$: 23, $H_2$: balance | 900 | 16 |
| TiCN | $TiCl_4$: 1, $N_2$: 10, $CH_3CN$: 0.1→0.4, $H_2$: balance | 850 | 9 |
| A-1 | $TiCl_4$: 1, $CO_2$: 2, $H_2$: balance | 850 | 10 |
| A-2 | $TiCl_4$: 1, $CO_2$: 10, $H_2$: balance | 850 | 10 |
| A-3 | $TiCl_4$: 1, $CO_2$: 0.1, $H_2$: balance | 850 | 10 |
| B-1 | $TiCl_4$: 1, $N_2$: 10, $CH_4$: 2, $H_2$: balance | 1010 | 9 |
| B-2 | $TiCl_4$: 1, $N_2$: 10, $CH_4$: 2, $CO_2$: 5, $H_2$: balance | 1010 | 9 |
| C-1 | $TiCl_4$: 7, $CH_4$: 3.5, $N_2$: 5, CO: 1, $H_2$: balance | 1000 | 15 |
| C-2 | $TiCl_4$: 7, $CH_4$: 3.5, $N_2$: 15, CO: 1, $H_2$: balance | 1000 | 15 |
| C-3 | $TiCl_4$: 7, $CH_4$: 3.5, $N_2$: 5, $H_2$: balance | 1000 | 15 |
| $Al_2O_3$ | $AlCl_3$: 7, HCl: 1, $CO_2$: 1, $H_2S$: 0.5, $H_2$: balance | 1000 | 10 |
| TiN-2 | $TiCl_4$: 2, $N_2$: 40, $H_2$: balance | 1010 | 80 |

TABLE 2

| | Ground layer | Lower layer (Composition (% by atom), Width · Height (nm)) | | | | | | | First layer (Composition (% by atom)) | | | | |
|---|---|---|---|---|---|---|---|---|---|---|---|---|---|
| | Species | | | | Mean crystal | Second protrusion | | | | | | | |
| Sample No. | (Thickness (μm)) | C | N | O | width (nm) | Width | Height | Thickness (μm) | Condition | C | N | O | Thickness (nm) |
| 1 | TiN-1 (0.5) | 60 | 40 | <0.05 | 500 | 250 | 100 | 9 | A-1 | 68 | 27 | 5 | 10 |
| 2 | TiN-1 (0.5) | 60 | 40 | <0.05 | 600 | 250 | 150 | 6 | A-2 | 70 | 20 | 10 | 15 |
| 3 | TiN-1 (0.5) | 60 | 40 | <0.05 | 400 | 250 | 50 | 12 | A-1 | 68 | 27 | 5 | 35 |
| 4 | TiN-1 (1.0) | 40 | 60 | <0.05 | 800 | 320 | 80 | 9 | A-1 | 50 | 44 | 6 | 5 |
| 5 | — | 70 | 30 | <0.05 | 550 | 300 | 50 | 9 | A-1 | 80 | 16 | 4 | 20 |
| 6 | TiN-1 (1.0) | 40 | 60 | <0.05 | 600 | 320 | 80 | 9 | | | | — | |
| 7 | TiN-1 (0.5) | 60 | 40 | <0.05 | 500 | 250 | 100 | 9 | A-1 | 68 | 27 | 5 | 10 |

TABLE 2-continued

| | | | | | | | | | | | | | |
|---|---|---|---|---|---|---|---|---|---|---|---|---|---|
| 8 | TiN-1 (0.5) | 60 | 40 | <0.05 | 500 | 250 | 100 | 9 | A-1 | 68 | 27 | 5 | 10 |
| 9 | TiN-1 (0.5) | 60 | 40 | <0.05 | 500 | 250 | 100 | 9 | A-3 | 70 | 29 | 1 | 10 |
| 10 | TiN-1 (0.5) | 60 | 40 | <0.05 | 500 | 250 | 100 | 9 | A-1 | 68 | 27 | 5 | 10 |

Coating layer

| | Second layer (Composition (% by atom), Thickness · Length (nm), Number of pieces (piece)) | | | | | | | Third layer (Composition (% by atom), Width · Height (nm)) | | | | | | |
|---|---|---|---|---|---|---|---|---|---|---|---|---|---|---|
| | | | | | | Projection | | | | | | First protrusion | | Thickness |
| Sample No. | Condition | C | N | O | Thickness | Length | Number of pieces | Condition | C | N | O | Width | Height | (nm) |
| 1 | C-1 | 64 | 0 | 36 | 20 | 80 | 3 | B-1 | 69 | 30 | 1 | 150 | 110 | 85 |
| 2 | C-1 | 58 | 0 | 42 | 10 | 100 | 4 | B-1 | 67 | 29 | 4 | 100 | 150 | 100 |
| 3 | C-2 | 48 | 20 | 32 | 35 | 40 | 3 | B-1 | 69 | 30 | 1 | 130 | 110 | 70 |
| 4 | C-1 | 64 | 0 | 36 | 20 | — | — | B-1 | 60 | 38 | 2 | 250 | 100 | 300 |
| 5 | C-1 | 64 | 0 | 36 | 40 | 20 | 1 | B-1 | 73 | 24 | 3 | 250 | 60 | 50 |
| 6 | C-2 | 48 | 20 | 32 | 30 | — | — | B-1 | 50 | 50 | <0.05 | 280 | 80 | 85 |
| 7 | C-1 | 64 | 12 | 24 | 20 | — | — | — | — | — | — | — | — | — |
| 8 | | | | | — | | | B-1 | 69 | 30 | 1 | 200 | 110 | 85 |
| 9 | C-1 | 84 | 0 | 36 | 20 | — | — | B-2 | 69 | 26 | 5 | 200 | 100 | 85 |
| 10 | C-3 | 64 | 35 | 1 | 20 | — | — | B-1 | 69 | 30 | 1 | 200 | 110 | 85 |

TABLE 3

| | Coating layer | | | | | Surface layer | Cutting performance | |
|---|---|---|---|---|---|---|---|---|
| | Upper layer | | | | | | | |
| | | Tc (104) | | | | | | |
| Sample No. | Thickness (μm) | Base member side | Surface side | First strongest peak | Second strongest peak | Species (Thickness (μm)) | Flank wear width (mm) | Number of impacts (Times) |
| 1 | 6 | 0.7 | 3.1 | (104) | (116) | TiN-2 (1.5) | 0.09 | 3800 |
| 2 | 7 | 1.1 | 2.8 | (104) | (116) | — | 0.14 | 3500 |
| 3 | 3 | 0.5 | 2 | (116) | (104) | TiN-2 (1.5) | 0.15 | 3300 |
| 4 | 6 | 2 | 2 | (104) | (116) | TiN-2 (3) | 0.19 | 3100 |
| 5 | 6 | 0.8 | 1.1 | (110) | (104) | TiN-2 (1) | 0.21 | 3250 |
| 6 | 8 | 1.2 | 1.1 | (012) | (110) | TiN-2 (1) | 0.37 | 2650 |
| 7 | 7 | 1 | 0.7 | (012) | (110) | TiN-2 (0.5) | 0.48 | 2200 |
| 8 | 7 | 0.8 | 1.2 | (012)* | (110)* | TiN-2 (2) | 0.49 | 1700 |
| 9 | 7 | 0.6 | 1.2 | (012) | (110) | TiN-2 (2) | 0.31 | 1800 |
| 10 | 7 | 0.7 | 1 | (012)* | (110)* | TiN-2 (2) | 0.39 | 1500 |

According to the results in Tables 1 to 3, Sample Nos. 6-8, each lacking any one of the first layer, the second later, and the third layer, had a larger flank wear width and reached a fracture by a small number of impacts. Sample No. 9 in which z1<z2, and Sample No. 10 in which z2=z3 also had a large flank wear width and reached a fracture by a small number of impacts. In Sample No. 8 lacking the second layer, and Sample No. 10 in which z2=z3, a peak of κ-type crystal structure, besides α-type crystal structure, was observed in the peaks of the upper layer during the X-ray diffraction measurement.

In contrast, a flank wear width was small and the number of impacts exceeded 3000 in Sample Nos. 1 to 5 in which, when the titanium compound contained in the first layer $8a$ is represented by $TiC_{x1}N_{y1}O_{z1}$, $0 \leq x1 < 1$, $0 \leq y1 < 1$, $0 < z1 < 1$, and $x1 + y1 + z1 = 1$; when the titanium compound contained in the second layer $8b$ is represented by $TiC_{x2}N_{y2}O_{z2}$, $0 \leq x2 < 1$, $0 \leq y2 < 1$, $0 < z2 < 1$, and $x2 + y2 + z2 = 1$; and when the titanium compound contained in the third layer $8c$ is represented by $TiC_{x3}N_{y3}O_{z3}$, $0 \leq x3 < 1$, $0 \leq y3 < 1$, $0 \leq z3 < 1$, and $x3 + y3 + z3 = 1$.

In Sample Nos. 1 to 4 of Sample Nos. 1 to 5, the second layer excluding the needle-shaped projections had a thickness of 10-35 nm, the flank wear width was small, and the number of impacts was large.

In Sample Nos. 1 to 3, and 5, in which the second layer had needle-shaped projections being projected upward, fracture resistance was improved, and the number of impacts was increased.

In Sample Nos. 1 to 4, in which an orientation coefficient Tc(104) on the surface side was 2 or more in the X-ray diffraction analysis of the upper layer, wear resistance was high and flank wear width was small. In Sample Nos. 1 to 3, and 5, in which an orientation coefficient Tc(104) on the base member side was smaller than the orientation coefficient Tc(104) on the surface side, fracture resistance was improved and the number of impacts was increased. Moreover, in Sample Nos. 1 to 4, in which one of I(104) and I(116) was made of the strongest peak and the other was made of the second strongest peak in the surface side peaks of the upper layer, it was found that these samples had a smaller flank wear width and had particularly excellent wear resistance.

DESCRIPTION OF THE REFERENCE NUMERAL 1 cutting tool (tool)
2 rake surface
3 flank surface
4 cutting edge
5 base member
6 coating layer
7 lower layer
8 intermediate layer
8a first layer
8b second layer
8c third layer
9 upper layer
10 ground layer
11 surface layer
12 crystal of titanium carbonitride
13 projection
14 first protrusion
15 second protrusion
16 twin boundary

What is claimed is:

1. A cutting tool, comprising:
a base member; and
a coating layer located on a surface of the base member, wherein the coating layer comprises:
   a lower layer comprising titanium carbonitride;
   an upper layer which is located above the lower layer and comprises aluminum oxide of α-type crystal structure; and
   an intermediate layer located between the lower layer and the upper layer,
      wherein the intermediate layer comprises:
         a first layer which is adjacent to the lower layer and comprises $TiC_{x1}N_{y1}O_{z1}$ ($0 \leq x1 < 1$, $0 \leq y1 < 1$, $0 < z1 < 1$, and $x1+y1+z1=1$),
         a second layer which is adjacent to the upper layer and comprises $TiC_{x2}N_{y2}O_{z2}$ ($0 \leq x2 < 1$, $0 \leq y2 < 1$, $0 < z2 < 1$, and $x2+y2+z2=1$, and
         a third layer which is located between the first layer and the second layer and comprises $TiC_{x3}N_{y3}O_{z3}$ ($0 \leq x3 < 1$, $0 \leq y3 < 1$, $0 \leq z3 < 1$, and $x3+y3+z3=1$),
      wherein $z1 > z3$ and $z2 > z3$,
   wherein the second layer comprises a plurality of needle-shaped projections being projected upward in a cross section orthogonal to the surface of the base member, and
   wherein the third layer comprises a first protrusion being protruded upward, and at least one of the plurality of needle-shaped projections is projected upward from a top portion of the first protrusion.

2. The cutting tool according to claim 1, wherein $z1 < z2$.

3. The cutting tool according to claim 1, wherein the lower layer comprises a second protrusion being protruded upward, and the at least one of the plurality of needle-shaped projections is located on an imaginary straight line passing through a top portion of the first protrusion and a top portion of the second protrusion.

4. The cutting tool according to claim 3, wherein a length of the at least one of the plurality of needle-shaped projections on the imaginary straight line is greater than a length of the third layer on the imaginary straight line.

5. The cutting tool according to claim 1, wherein the second layer has a thickness of 10-35 nm.

6. The cutting tool according to claim 1, wherein the first layer has a thickness of 5-50 nm, and the third layer has a thickness of 50-300 nm.

7. The cutting tool according to claim 1, wherein an orientation coefficient Tc(104) of the upper layer is 2 or more from a surface side of the coating layer, and which is expressed by a following general formula Tc(hkl),
   an orientation coefficient $Tc(hkl) = \{I(hkl)/I_0(hkl)\} / [(\frac{1}{9}) \times \Sigma\{I(HKL)/I_0(hkl)\}]$, wherein
   (HKL) is a crystal plane of (012), (104), (110), (113), (024), (116), (214), (146), and (006),
   I is peak strength ascribed to each of the crystal planes, and
   $I_0$ is a standard diffraction intensity of each of crystal planes described on JCPDS (Joint Committee on Powder Diffraction Standards) card No. 00-010-0173.

8. The cutting tool according to claim 7, wherein the orientation coefficient Tc(104) on the base member side is smaller than the orientation coefficient Tc(104) on a surface side in the upper layer.

9. The cutting tool according to claim 7, wherein one of I(116) and I(104) has a strongest X-ray diffraction intensity I(hkl) from the surface side of the coating layer and another of I(116) and I(104) has a second strongest X-ray diffraction intensity I(hkl) from the surface side of the coating layer.

10. A cutting tool, comprising:
a base member; and
a coating layer located on a surface of the base member, wherein the coating layer comprises:
   a lower layer comprising titanium carbonitride;
   an upper layer which is located above the lower layer and comprises aluminum oxide of α-type crystal structure; and
   an intermediate layer located between the lower layer and the upper layer,
      wherein the intermediate layer comprises:
         a first layer which is adjacent to the lower layer and comprises $TiC_{x1}N_{y1}O_{z1}$ ($0 \leq x1 < 1$, $0 \leq y1 < 1$, $0 < z1 < 1$, and $x1+y1+z1=1$), a second layer which is adjacent to the upper layer and comprises $TiC_{x2}N_{y2}O_{z2}$ ($0 \leq x2 < 1$, $0 \leq y2 < 1$, $0 < z2 < 1$, and $x2+y2+z2=1$, and a third layer which is located between the first layer and the second layer and comprises $TiC_{x3}N_{y3}O_{z3}$ ($0 \leq x3 < 1$, $0 \leq y3 < 1$, $0 \leq z3 < 1$, and $x3+y3+z3=1$), wherein $z1 > z3$ and $z2 > z3$, and wherein the first layer has a thickness of 5-50 nm, and the third layer has a thickness of 50-300 nm.

* * * * *

UNITED STATES PATENT AND TRADEMARK OFFICE
CERTIFICATE OF CORRECTION

PATENT NO. : 10,682,707 B2
APPLICATION NO. : 15/779532
DATED : June 16, 2020
INVENTOR(S) : Yoshikazu Kodama et al.

It is certified that error appears in the above-identified patent and that said Letters Patent is hereby corrected as shown below:

In the Specification

Columns 11-12, TABLE 2, Column Ground layer, Second Row, insert a line under the words Ground layer.

Columns 11-12, TABLE 2, Column Coating layer, Second Row, change 'First layer' to -- First layer (Composition (% by atom)) --; insert a line thereunder.

Columns 11-12, TABLE 2, Column First layer, Third Row, delete "(Composition (% by atom))"; delete the line below the words (Composition (% by atom)).

Columns 11-12, TABLE 2, Column Height, Third Row, change '50' to -- 60 --.

Columns 13-14, TABLE 2-continued, Column Coating layer, First Row, change 'Third layer' to -- Third layer (Composition (% by atom), Width • Height (nm)) --; insert a line thereunder.

Columns 13-14, TABLE 2-continued, Third layer, First Row, delete "(Composition (% by atom), Width • Height (nm))"; delete the line below the words (Composition (% by atom), Width • Height (nm)).

Columns 13-14, TABLE 2-continued, Column C, Line No. 9, change '84' to -- 64 --.

Columns 13-14, TABLE 3, Column Coating layer, First Row, insert -- Cutting performance --; insert a line thereunder.

Columns 13-14, TABLE 3, Column Coating layer, First Row, insert -- Surface layer --; insert a line thereunder.

Columns 13-14, TABLE 3, Column Cutting performance, Second Row, delete "Cutting performance"; delete the line below.

Signed and Sealed this
Eighth Day of December, 2020

Andrei Iancu
*Director of the United States Patent and Trademark Office*